(12) United States Patent
Kamihara et al.

(10) Patent No.: US 9,071,050 B2
(45) Date of Patent: Jun. 30, 2015

(54) CURRENT GENERATING DEVICE

(75) Inventors: Nobuyuki Kamihara, Tokyo (JP);
Yuichiro Kamino, Tokyo (JP); Tooru Hashigami, Tokyo (JP); Hiroki Makimura, Tokyo (JP); Koki Higashide, Tokyo (JP); Masaki Kitaoka, Hyogo (JP); Naotatsu Ishimaru, Hyogo (JP)

(73) Assignees: MITSUBISHI HEAVY INDUSTRIES, LTD., Tokyo (JP); OTOWA ELECTRIC CO., LTD., Osaka (JP)

( * ) Notice: Subject to any disclaimer, the term of this patent is extended or adjusted under 35 U.S.C. 154(b) by 257 days.

(21) Appl. No.: 13/698,151

(22) PCT Filed: May 19, 2011

(86) PCT No.: PCT/JP2011/061495
§ 371 (c)(1),
(2), (4) Date: Nov. 15, 2012

(87) PCT Pub. No.: WO2011/145675
PCT Pub. Date: Nov. 24, 2011

(65) Prior Publication Data
US 2013/0057996 A1    Mar. 7, 2013

(30) Foreign Application Priority Data
May 20, 2010   (JP) ................................ 2010-116197

(51) Int. Cl.
*H02H 3/08*     (2006.01)
*H02H 9/02*     (2006.01)
(Continued)

(52) U.S. Cl.
CPC . *H02H 7/06* (2013.01); *H02H 3/05* (2013.01); *H02H 3/087* (2013.01); *H03K 3/53* (2013.01)

(58) Field of Classification Search
USPC ........................................................ 361/93.1
See application file for complete search history.

(56) References Cited

U.S. PATENT DOCUMENTS 6,650,091 B1    11/2003   Shiue et al.
7,586,725 B2 *   9/2009   DiVito et al. ................ 361/93.1
(Continued)

FOREIGN PATENT DOCUMENTS

JP    60-261328    12/1985
JP    62-139799     6/1987
(Continued)

OTHER PUBLICATIONS

International Search Report issued Aug. 9, 2011 in corresponding International Application No. PCT/JP2011/061495.
(Continued)

*Primary Examiner* — Dharti Patel
(74) *Attorney, Agent, or Firm* — Wenderoth, Lind & Ponack, L.L.P.

(57) ABSTRACT

Even when a large-current, high-voltage load is applied, damage is prevented. A current generating device (1) supplies a current simulating a current flowing when lightning occurs to a test piece (9) subjected to a lightning resistance test using power supplied from a power supply device (2). The current generating device (1) includes electric double-layer capacitors that store and discharge power supplied from the power supply device (2), a semiconductor switch (3) that switches between supplying and not supplying the power stored in the electric double-layer capacitors to the test piece (9), and a protection unit (4) that is connected between the semiconductor switch (3) and the test piece (9) and that cuts the connection between the semiconductor switch (3) and the test piece (9) when a current larger than a predetermined value flows through the semiconductor switch (3).

14 Claims, 2 Drawing Sheets

(51) Int. Cl.
*H02H 7/06* (2006.01)
*H02H 3/087* (2006.01)
*H03K 3/53* (2006.01)
*H02H 3/05* (2006.01)

(56) References Cited

U.S. PATENT DOCUMENTS

| | | | |
|---|---|---|---|
| 8,781,637 B2* | 7/2014 | Eaves | 700/286 |
| 2003/0214269 A1 | 11/2003 | Shiue et al. | |
| 2008/0197699 A1* | 8/2008 | Yu et al. | 307/9.1 |
| 2009/0079191 A1* | 3/2009 | Mari et al. | 290/43 |
| 2010/0196067 A1* | 8/2010 | Biegelsen | 399/336 |

FOREIGN PATENT DOCUMENTS

| | | |
|---|---|---|
| JP | 62-133168 | 8/1987 |
| JP | 62-293171 | 12/1987 |
| JP | 5-159909 | 6/1993 |
| JP | 5-205849 | 8/1993 |
| JP | 6-148296 | 5/1994 |
| JP | 2003-324968 | 11/2003 |
| JP | 2003-333871 | 11/2003 |
| JP | 2004-245174 | 9/2004 |
| JP | 3756850 | 3/2006 |
| JP | 2007-282313 | 10/2007 |
| JP | 2009-21376 | 1/2009 |
| JP | 2009-276154 | 11/2009 |

OTHER PUBLICATIONS

Written Opinion of the International Searching Authority issued Aug. 9, 2011 in corresponding International Application No. PCT/JP2011/061495.

"Aircraft Lightning Environment and Related Test Waveforms", SAE ARP 5412-REV. A, Nov. 1999, pp. 1-56.

Notice of Reason(s) for Refusal issued Dec. 2, 2014 in corresponding Japanese Application No. 2010-116197 (with English translation).

* cited by examiner

CURRENT GENERATING DEVICE

TECHNICAL FIELD

The present invention relates to current generating devices.

BACKGROUND ART

In order to test the influence of a lightning strike on, for example, an aircraft, a current generating device that generates a current distribution simulating a lightning surge occurring when hit by a lightning strike has been proposed. A known current generating device in the related art used for a lightning resistance test stores electric charge using a secondary battery and generates a current from the electric charge stored in the secondary battery. It is known that the life of the secondary battery expires at a relatively early stage due to repeated lightning resistance tests and repeated charging and discharging. For this reason, the secondary battery requires frequent replacement, and the ease of maintenance of the current generating device is poor. Furthermore, because the secondary battery requires a long time to charge, the test interval between completion of one test and the next test is long, which is problematic.

To overcome the above-described problems, a technology has been proposed in which an electric double-layer capacitor, which is a power storage device that has a longer life than a secondary battery, is capable of storing energy in a short time, and is easy to maintain, is used to generate a large current, instead of a secondary battery (for example, see PTL 1).

CITATION LIST

Patent Literature

{PTL 1} The Publication of Japanese Patent No. 3756850

SUMMARY OF INVENTION

Technical Problem

However, the method disclosed in PTL 1 has a problem in that, when an electric double-layer capacitor is intensively charged with a large current and a high voltage to simulate lightning, the electric double-layer capacitor may catch fire or may be damaged. There is another problem in that, when simultaneously performing a test using another test apparatus, if a large current or the like flows back through a test piece etc., a switch that switches the current supply to the test piece on and off is damaged.

The present invention has been made in view of these circumstances, and an object thereof is to provide a current generating device that can prevent damage even when a large-current, high-voltage load is applied.

Solution to Problem

To solve the above-described problems, the present invention employs the following solutions.

A first aspect of the present invention is a current generating device that supplies a current simulating a current flowing when lightning occurs to a test piece subjected to a lightning resistance test using power supplied from a power supply device. The current generating device includes electric double-layer capacitors that store and discharge power supplied from the power supply device; a semiconductor switch that switches between supplying and not supplying the power stored in the electric double-layer capacitors to the test piece; and a protection unit that is connected between the semiconductor switch and the test piece and that cuts the connection between the semiconductor switch and the test piece when a current larger than a predetermined value flows through the semiconductor switch.

With this configuration, the electric double-layer capacitors store the power supplied from the power supply device, and, when the semiconductor switch is switched, the stored power is supplied to the test piece. Furthermore, when a current larger than a predetermined value flows through the semiconductor switch, the protection unit provided between the semiconductor switch and the test piece cuts the connection between the semiconductor switch and the test piece.

Because the electric double-layer capacitors are used in this manner, compared with the case where a secondary battery is used, the deterioration rate of the current generating device, serving as a charging/discharging device, can be reduced. As a result, the frequency of replacement of the charging/discharging device by an operator decreases compared with the case where a secondary battery is used, which improves the ease of maintenance of the current generating device.

Furthermore, because the semiconductor switch switches between supplying and not supplying the power stored in the electric double-layer capacitors to the test piece, it is possible to make adjustments (and fine adjustments) of the application time, such as setting a relatively short application time (on the millisecond time scale) or setting a long application time. Moreover, when a current larger than a predetermined value flows through the semiconductor switch, the connection to the test piece is cut. Thus, even if a large current flows back from the test piece while conducting a test using a high voltage and a large current simulating, for example, a lightning situation, in which a plurality of different circuits are connected to the test piece, the connection is cut off by the protection unit, thereby protecting the semiconductor switch.

It is preferable that the protection unit of the above-described current generating device include at least one of a first arrester and a fuse.

By providing at least one of the first arrester and the fuse, even when, for example, a large current flows back from the test piece, the connection between the semiconductor switch and the test piece can be reliably disconnected.

A second arrester may be provided between the protection unit of the current generating device and the semiconductor switch.

Because the second arrester is provided between the protection unit and the semiconductor switch, the connection between the protection unit and the semiconductor switch can be disconnected. For example, even if the protection unit does not work properly and fails to disconnect from the test piece despite that a current larger than a predetermined value flows through the semiconductor switch, the provision of the second arrester enables the test piece to be reliably disconnected from the semiconductor switch.

A second aspect of the present invention is a test apparatus for an aircraft, the test apparatus including any one of the above-described the current generating devices, wherein the test piece is a structural member of an aircraft.

A third aspect of the present invention is a test apparatus for a wind turbine generator, the test apparatus comprising any one of the above-described the current generating devices, wherein the test piece is a structural member of a wind turbine generator.

Advantageous Effects of Invention

The present invention provides an advantage in that it can prevent damage even when a large-current, high-voltage load is applied.

DESCRIPTION OF EMBODIMENTS

An embodiment of a current generating device of the present invention will be described below with reference to the drawings.

An embodiment of the present invention will be described below, using FIGS. 1 and 2.

The current generating device according to this embodiment will be described below, taking as an example a case where a structural member of an aircraft (for example, composed of a composite material such as FRP) is used as a test piece, and a current simulating a current flowing when lightning occurs is supplied to the test piece. However, the test piece is not limited thereto.

Figure 1:
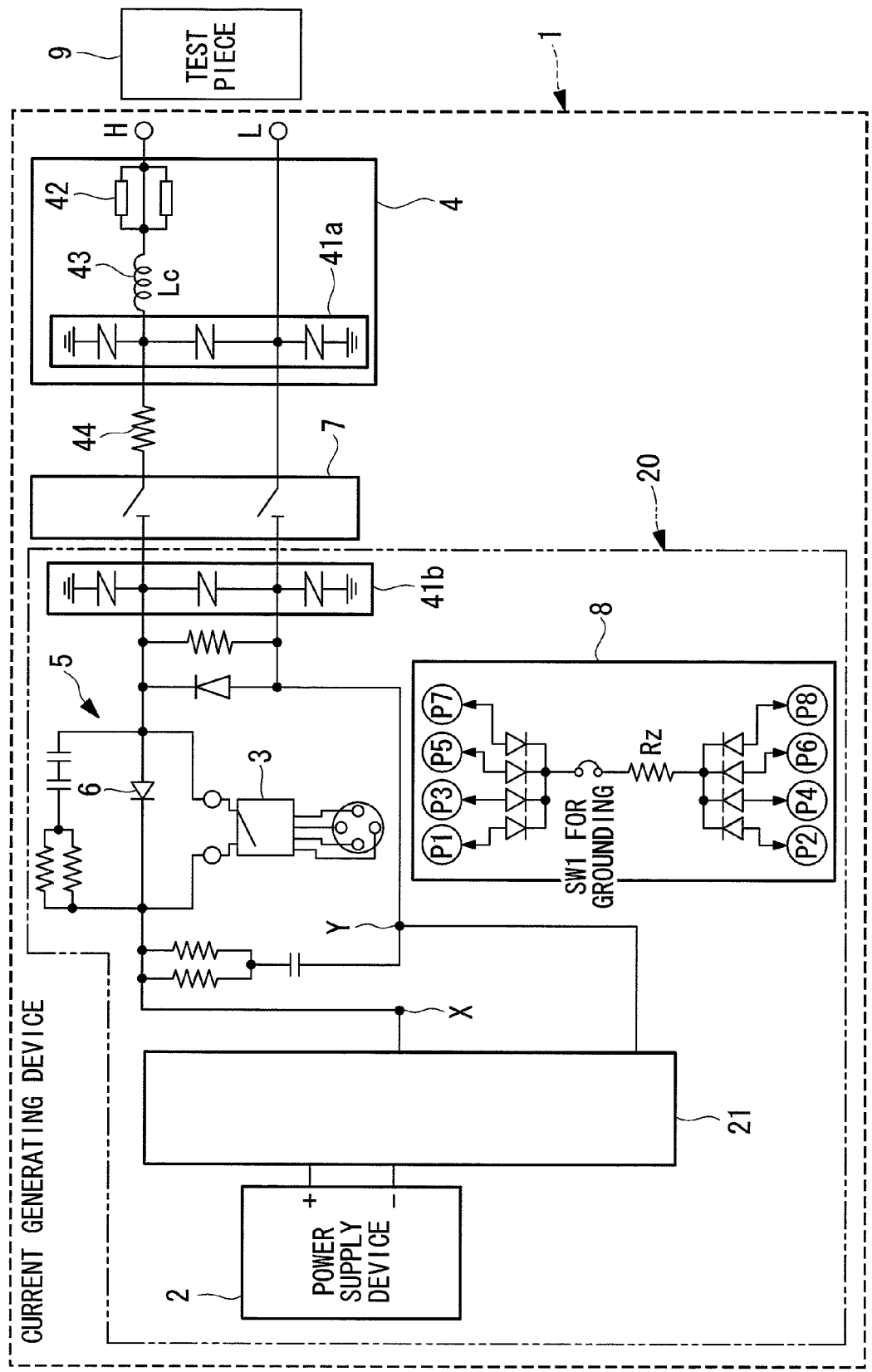
FIG. 1 is a circuit diagram showing a current generating device according to an embodiment of the present invention.

As shown in FIG. 1, the current generating device 1 includes a generator 20, a disconnector 7, a protection unit 4, and a control unit (illustration thereof is omitted). The generator 20 is connected to the protection unit 4 via the disconnector 7.

The disconnector 7, by being controlled by the control unit (not shown), connects or disconnects the generator 20 and the protection unit 4. For example, the generator 20 can supply a current to the test piece 9 via the protection unit 4, and, when a replacement operator replaces the test piece, the disconnector 7 is turned off (disconnected) to disconnect the generator 20 from the protection unit 4 to ensure safety.

The generator 20 includes a power supply device 2, a charging/discharging unit 21, a semiconductor switch 3, a snubber circuit 5, a diode 6, and a ground circuit 8.

The power supply device 2 is a constant-voltage constant-current power supply capable of charging at a constant current. Furthermore, the power supply device 2 is a power supply capable of supplying a maximum charging voltage that corresponds to, for example, the number of electric double-layer capacitors C connected in series (for example, 540 V in the case where 40 electric double-layer capacitors C are connected in series).

Figure 2:
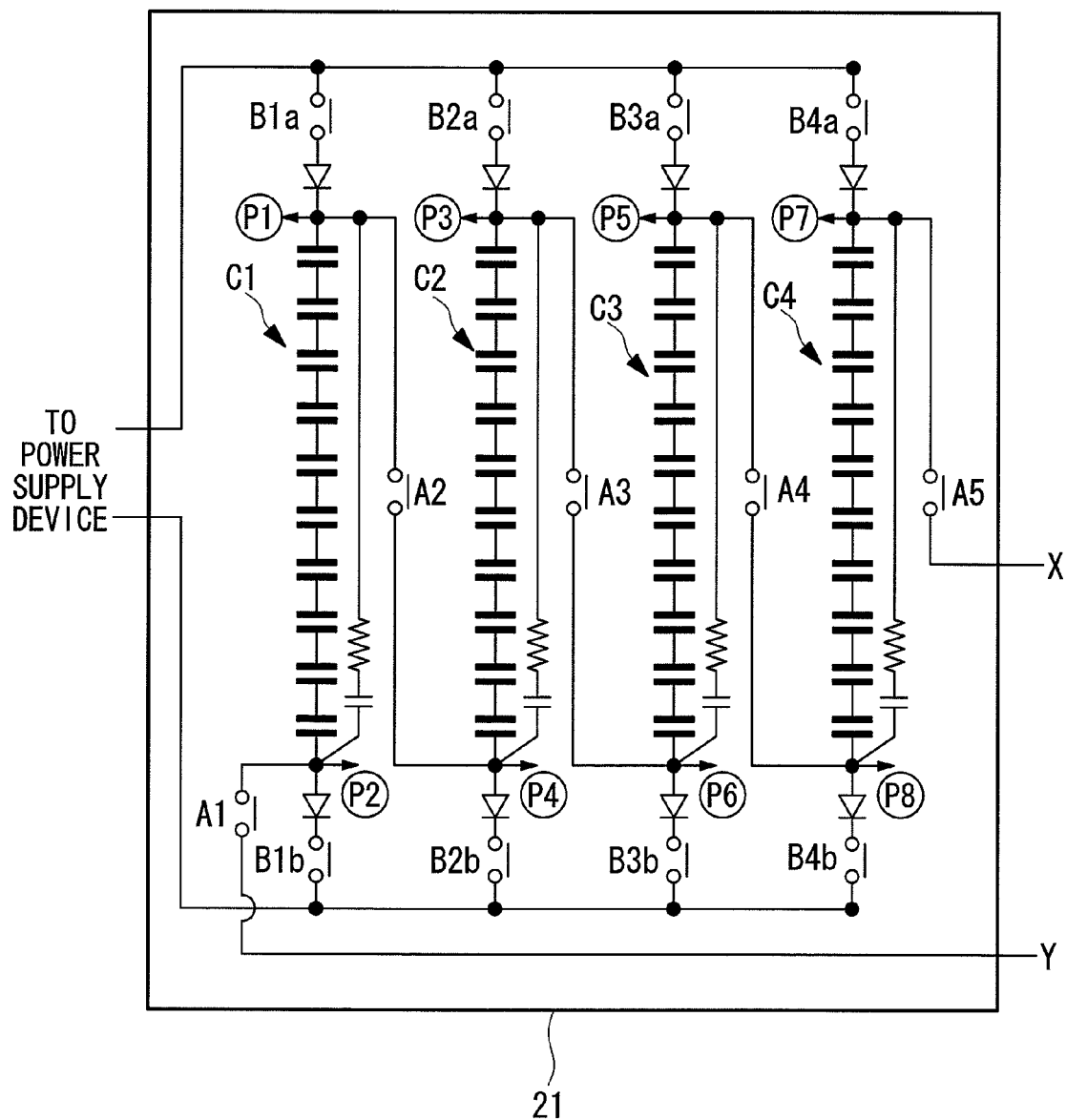
FIG. 2 is a circuit diagram showing a charging/discharging unit of the current generating device according to the embodiment of the present invention.

FIG. 2 is a circuit diagram showing the charging/discharging unit 21. As shown in FIG. 2, the charging/discharging unit 21 includes electric double-layer capacitors C1, C2, C3, and C4, first electromagnetic contactors B1a and B1b to B4a and B4b, and second electromagnetic contactors A1 to A5. Hereinbelow, unless otherwise specifically stated, the first electromagnetic contactors are denoted by "first electromagnetic contactors B", the second electromagnetic contactors are denoted by "second electromagnetic contactors A", and the electric double-layer capacitors are denoted by "electric double-layer capacitors C".

The electric double-layer capacitors C store and discharge the power supplied from the power supply device. In this embodiment, 10 capacitors connected in series are grouped into one set, and four such sets are provided. Furthermore, the following description will be given based on the assumption that the electric double-layer capacitors C are those having a large electrostatic capacitance and capable of being stored in an uncharged state. Furthermore, in this embodiment, when charging, the four sets of electric double-layer capacitors C are connected in parallel to the power supply device 2 (in other words, four rows of ten series-connected capacitors are connected in parallel), and when discharging, the four sets of electric double-layer capacitors C are connected in series (in other words, 40 capacitors are connected in series).

The first electromagnetic contactors B are turned on when charging the electric double-layer capacitors C and are turned off when discharging them. Furthermore, the first electromagnetic contactors B are connected in order to enable connection between upstream portions of the plurality of electric double-layer capacitors C and between downstream portions of the plurality of electric double-layer capacitors C. For example, as shown in FIG. 2, the first electromagnetic contactor B1a, the electric double-layer capacitor C1, and the first electromagnetic contactor B1b are connected in series; the first electromagnetic contactor B2a, the electric double-layer capacitor C2, and the first electromagnetic contactor B2b are connected in series; the first electromagnetic contactor B3a, the electric double-layer capacitor C3, and the first electromagnetic contactor B3b are connected in series; the first electromagnetic contactor B4a, the electric double-layer capacitor C4, and the first electromagnetic contactor B4b are connected in series; and terminals thereof on the upstream side and downstream side are connected to the power supply device 2.

The second electromagnetic contactors A are turned on when discharging the electric double-layer capacitors C and are turned off when charging them. When the second electromagnetic contactors A are turned on, the plurality of electric double-layer capacitors C are connected in series to the semiconductor switch 3. Furthermore, the second electromagnetic contactors A are connected in order to enable connection between upstream portions and downstream portions of different electric double-layer capacitors C. For example, as shown in FIG. 2, the second electromagnetic contactor A2 is connected between the upstream portion of the electric double-layer capacitor C1 and the downstream portion of the electric double-layer capacitor C2, the second electromagnetic contactor A3 is connected between the upstream portion of the electric double-layer capacitor C2 and the downstream portion of the electric double-layer capacitor C3, the second electromagnetic contactor A4 is connected between the upstream portion of the electric double-layer capacitor C3 and the downstream portion of the electric double-layer capacitor C4, the second electromagnetic contactor A5 is connected between the upstream portion of the electric double-layer capacitor C4 and the upstream portion of the semiconductor switch 3, and the second electromagnetic contactor A1 is connected between the downstream portion of the electric double-layer capacitor C1 and the downstream portion of the semiconductor switch 3.

Referring back to FIG. 1, turning on or off the semiconductor switch 3 switches between supplying and not supplying electric charge stored in the electric double-layer capacitors C to the test piece 9. Furthermore, the semiconductor switch 3 is connected in parallel to the snubber circuit 5 and the diode 6 to reduce noise entering from other devices. The semiconductor switch 3 serves as a discharge switch, and the on-off time thereof is controlled on the millisecond time scale.

The ground circuit 8 is a circuit that discharges the electric charge stored in the electric double-layer capacitors C. For example, when tests using the current generating device 1 are finished at night etc., connection points P1 to P8 of the ground circuit 8 are respectively connected to connection points P1 to P8 of the electric double-layer capacitors C1, C2, C3, and C4. Thus, the electric charge stored in the electric double-layer capacitors C can be discharged through the ground circuit 8.

The protection unit 4 is connected between the generator 20 and the test piece 9 and cuts the connection between the generator 20 and the test piece 9 when a current larger than a predetermined level flows through the semiconductor switch 3 (described in detail below) provided in the generator 20. More specifically, the protection unit 4 includes an arrester (first arrester) 41a, fuses 42, and an inductor 43. Furthermore, the protection unit 4 includes connection points H and L for supplying a current output through the protection unit 4 to the test piece 9. The protection unit 4 can be attached to and detached from the generator 20 via the disconnector 7 and can be easily replaced wholly or partially, when a portion (for example, the arrester 41a) of the protection unit 4 is damaged.

In the protection unit 4, the inductor 43 and the fuses 42 are connected in series between the disconnector 7 and the connection point H. Furthermore, on the upstream side of the inductor 43, MOVs (metal-oxide varistors) are provided at a position between the line leading to the connection point H and the line leading to the connection point L, at a position between the connection point H and the ground, and at a position between the connection point L and the ground, thereby forming the arrester 41a.

The inductor 43 is formed of a coil having an inductance of, for example, 3.5 mH.

The fuses 42 disconnect the connection to the generator 20 side before a maximum time for which the semiconductor switch 3 allows a predetermined amount of current to flow is reached. Furthermore, the type, number, etc., of the fuses 42 are determined by conducting a preliminary test. For example, in a 45-millisecond-interval test, the fuses 42 are connected in one-parallel configuration, and in a 500-millisecond-interval test, the fuses 42 are connected in a two-parallel configuration.

Next, the operation of the current generating device 1 according to this embodiment will be described using FIGS. 1 and 2. Herein, a description will be given assuming a case where the test piece 9 is an aircraft, the test piece 9 is connected to another test apparatus, and a test is performed simultaneously with the other test apparatus. Furthermore, the other test apparatus will be described as an apparatus that generates a standard lightning strike waveform shown in SAE ARP (AEROSPACE RECOMMENDED PRACTICE) 5412-REV.A "Aircraft Lightning Environment and Related Test Waveforms (regulations defining standard lightning strike waveforms in aircraft tests)" and that generates waveforms Comp. A, Comp. B, etc.

When the control unit turns on the first electromagnetic contactors B and turns off the second electromagnetic contactors A, the four sets of electric double-layer capacitors C are connected in parallel to the power supply device 2 and are charged. When a predetermined amount of electric charge is stored in the electric double-layer capacitors C, the control unit turns off the first electromagnetic contactors B and turns on the second electromagnetic contactors A. As a result, the charging/discharging unit 21 is disconnected from the power supply device 2, and the four sets of series-connected electric double-layer capacitors C are connected to the semiconductor switch 3. Furthermore, the protection unit 4 is connected to the test piece 9 via the connection points H and L, and, when the control unit turns on the disconnector 7, the generator 20 and the protection unit 4 are connected. Moreover, when the semiconductor switch 3 is turned on, a current (for example, 400 to 500 A) discharged from the charging/discharging unit 21 flows through the semiconductor switch 3. As a result, the current generated in the current generating device 1 (a current having a waveform Comp. C/C* defined in ARP 5412-A) is supplied to the test piece 9.

While the other test apparatus that supplies the currents Comp. A, Comp. B, etc. is connected to the test piece 9 and is simultaneously performing a test on the test piece, when a large current, such as Comp. A or Comp. B, supplied from the other test apparatus to the test piece 9 flows back to the current generating device 1 through the connection points H and L of the protection unit 4 and when a predetermined period of time (a period of time shorter than the maximum time for which the semiconductor switch 3 allows a predetermined amount of current to flow) has elapsed, the fuses 42 and the arrester 41a are activated to electrically disconnect the protection unit 4 from the generator 20 having the semiconductor switch 3. In this manner, it is possible to prevent a large current supplied from the other test apparatus from flowing through the semiconductor switch 3, and particularly in a test employing a high voltage and a large current, such as a lightning test, the current generating device 1 can be safely operated.

As has been described above, in the current generating device 1 according to this embodiment, the electric double-layer capacitors C store power supplied from the power supply device 2, and the stored power is supplied to the test piece 9 when the semiconductor switch 3 is switched. Furthermore, when a current larger than a predetermined value flows through the semiconductor switch 3, the protection unit 4 provided between the semiconductor switch 3 and the test piece 9 cuts the connection between the semiconductor switch 3 and the test piece 9. Because the electric double-layer capacitors C are used in this manner, the deterioration rate of the current generating device 1, serving as a charging/discharging device, can be reduced compared with the case where a secondary battery is used. As a result, the frequency of replacement of the charging/discharging device by an operator decreases compared with the case where a secondary battery is used, which improves the ease of maintenance of the current generating device 1.

Furthermore, because the semiconductor switch 3 switches between supplying and not supplying the power stored in the electric double-layer capacitors C to the test piece 9, it is possible to make adjustments (and fine adjustments) of the application time, such as setting a relatively short application time (on the millisecond time scale) or setting a long application time. Moreover, when a current larger than a predetermined value flows through the semiconductor switch 3, the connection to the test piece 9 is cut. Thus, even if a large current flows back from the test piece 9 while conducting a test using a high voltage and a large current simulating, for example, a lightning situation, in which a plurality of different circuits are connected to the test piece 9, the connection is cut off by the protection unit 4, thereby protecting the semiconductor switch 3.

Although the protection unit 4 has been described as one including the first arrester 41a and the fuses 42 in this embodiment, the protection unit 4 is not limited thereto. For example, either the first arrester 41a or the fuses 42 may be provided.

Furthermore, in addition to the above-described configuration, an arrester (second arrester) 41b may be provided between the semiconductor switch 3 and the test piece 9. With this configuration, even if the protection unit 4 fails to properly perform the operation of disconnecting from the generator 20 despite that a voltage higher than a predetermined value, for example, a lightning surge, is applied, it is possible to reliably disconnect the semiconductor switch 3 from the test piece 9, enabling the current generating device 1 to be more safely operated.

REFERENCE SIGNS LIST

1: current generating device
2: power supply device
3: semiconductor switch
4: protection unit
41a, 41b: first and second arrester
42: fuse
C1 to C4: electric double-layer capacitor

The invention claimed is:

1. A current generating device that supplies a current simulating a current flowing when lightning occurs to a test piece subjected to a lightning resistance test using power supplied from a power supply device, the current generating device comprising:
   electric double-layer capacitors that store and discharge power supplied from the power supply device;
   a semiconductor switch that switches between supplying and not supplying the power stored in the electric double-layer capacitors to the test piece; and
   a protection unit that is connected between the semiconductor switch and the test piece and that cuts the connection between the semiconductor switch and the test piece when a current which flows back from the test piece and which is larger than a predetermined value flows through the semiconductor switch.

2. The current generating device according to claim 1, wherein the protection unit includes at least one of a first arrester and a fuse.

3. The current generating device according to claim 1, further comprising a second arrester between the protection unit and the semiconductor switch.

4. A test apparatus for an aircraft, the test apparatus comprising the current generating device according to claim 1, wherein the test piece is a structural member of an aircraft.

5. A test apparatus for a wind turbine generator, the test apparatus comprising the current generating device according to claim 1, wherein the test piece is a structural member of a wind turbine generator.

6. The current generating device according to claim 2, further comprising a second arrester between the protection unit and the semiconductor switch.

7. A test apparatus for an aircraft, the test apparatus comprising the current generating device according to claim 2, wherein the test piece is a structural member of an aircraft.

8. A test apparatus for an aircraft, the test apparatus comprising the current generating device according to claim 3, wherein the test piece is a structural member of an aircraft.

9. A test apparatus for an aircraft, the test apparatus comprising the current generating device according to claim 6, wherein the test piece is a structural member of an aircraft.

10. A test apparatus for a wind turbine generator, the test apparatus comprising the current generating device according to claim 2, wherein the test piece is a structural member of a wind turbine generator.

11. A test apparatus for a wind turbine generator, the test apparatus comprising the current generating device according to claim 3, wherein the test piece is a structural member of a wind turbine generator.

12. A test apparatus for a wind turbine generator, the test apparatus comprising the current generating device according to claim 6, wherein the test piece is a structural member of a wind turbine generator.

13. The current generating device according to claim 1, wherein the current which flows back from the test piece is a current supplied to the test piece from another test apparatus which is different from the current generating device connected to the test piece.

14. The current generating device according to claim 13, wherein the another test apparatus is an apparatus that generates a standard lightning strike waveform.

* * * * *